United States Patent
Rathi et al.

(10) Patent No.: US 9,257,765 B2
(45) Date of Patent: Feb. 9, 2016

(54) CONNECTOR PIN ON SPRINGS

(71) Applicant: Amazon Technologies, Inc., Seattle, WA (US)

(72) Inventors: Nidhi Rathi, Sunnyvale, CA (US); Edward A. Lilgegren, San Francisco, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 14/615,152

(22) Filed: Feb. 5, 2015

(65) Prior Publication Data

US 2015/0171531 A1    Jun. 18, 2015

Related U.S. Application Data

(63) Continuation of application No. 13/560,701, filed on Jul. 27, 2012, now Pat. No. 8,995,141.

(51) Int. Cl.
| | |
|---|---|
| *H05K 5/00* | (2006.01) |
| *H01R 12/71* | (2011.01) |
| *H05K 1/18* | (2006.01) |
| *H05K 3/32* | (2006.01) |

(52) U.S. Cl.
CPC ............... *H01R 12/714* (2013.01); *H05K 1/18* (2013.01); *H05K 1/181* (2013.01); *H05K 3/32* (2013.01); *H05K 2201/0311* (2013.01); *H05K 2201/09063* (2013.01); *H05K 2201/09981* (2013.01); *H05K 2201/10037* (2013.01); *H05K 2201/10265* (2013.01); *H05K 2201/10416* (2013.01); *H05K 2201/10962* (2013.01)

(58) Field of Classification Search
CPC ........................... G06F 1/1632; H01M 2/1066
USPC ........................................ 361/679.01–679.03
See application file for complete search history.

(56) References Cited

U.S. PATENT DOCUMENTS

| | | | |
|---|---|---|---|
| 7,815,474 B1 | 10/2010 | Lin et al. | |
| 2003/0040216 A1 | 2/2003 | Youn | |
| 2003/0114203 A1* | 6/2003 | Lee | H01R 13/2421 455/572 |
| 2003/0176113 A1 | 9/2003 | Sasaki | |
| 2005/0047104 A1 | 3/2005 | Grunow et al. | |
| 2006/0166564 A1 | 7/2006 | Baranowski | |
| 2012/0206875 A1* | 8/2012 | Carnevali | G06F 1/1632 361/679.41 |

* cited by examiner

*Primary Examiner* — Jerry Wu
(74) *Attorney, Agent, or Firm* — Lowenstein Sandler LLP

(57) ABSTRACT

An electronic device includes a printed circuit board (PCB) with a first conductive element and having a first side opposite a second side. The electronic device includes a wall disposed on the first side of the PCB and having a channel through the wall. The electronic device includes a supporting structure disposed on the second side of the PCB. The electronic device includes a connector which includes an electrically conductive based configured to provide a conductive path between the first conductive element and the channel and also includes a spring structure disposed between the electrically conductive base and the supporting structure.

19 Claims, 9 Drawing Sheets

CONNECTOR PIN ON SPRINGS

CROSS-REFERENCE TO RELATED APPLICATIONS

This application is a continuation of U.S. patent application Ser. No. 13/560,701, filed Jul. 27, 2012, which is hereby incorporated by reference in its entirety.

BACKGROUND OF THE INVENTION

A large and growing population of users enjoy entertainment through the consumption of digital media items, such as music, movies, images, electronic books, and so on. Users employ various electronic devices to consume such media items. Among these electronic devices are electronic book readers, cellular telephones, personal digital assistants (PDAs), portable media players, tablet computers, netbooks, and the like.

These electronic devices often use include connectors used to couple electrical components of the electronic device.

BRIEF DESCRIPTION OF THE DRAWINGS

The present invention will be understood more fully from the detailed description given below and from the accompanying drawings of various embodiments of the present invention, which, however, should not be taken to limit the present invention to the specific embodiments, but are for explanation and understanding only. Further, it should be understood that the drawings are not necessarily proportional or to scale.

DETAILED DESCRIPTION OF THE PRESENT INVENTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of embodiments of the present invention.

Embodiments of an electrical connection between a first component and a second component are described. In one embodiment, a spring loaded connector, also referred to a pogo pin, couples the first and second component. In particular, the base of the spring loaded connector provides a complete electrical path between the first and second component, such that current need not be directed through the spring or other components of the spring loaded connector. In other embodiments, a physically separated base and spring are used to, respectively, couple the first and second component and provide a compressive force on the base and maintain the electrical connection.

Figure 1:
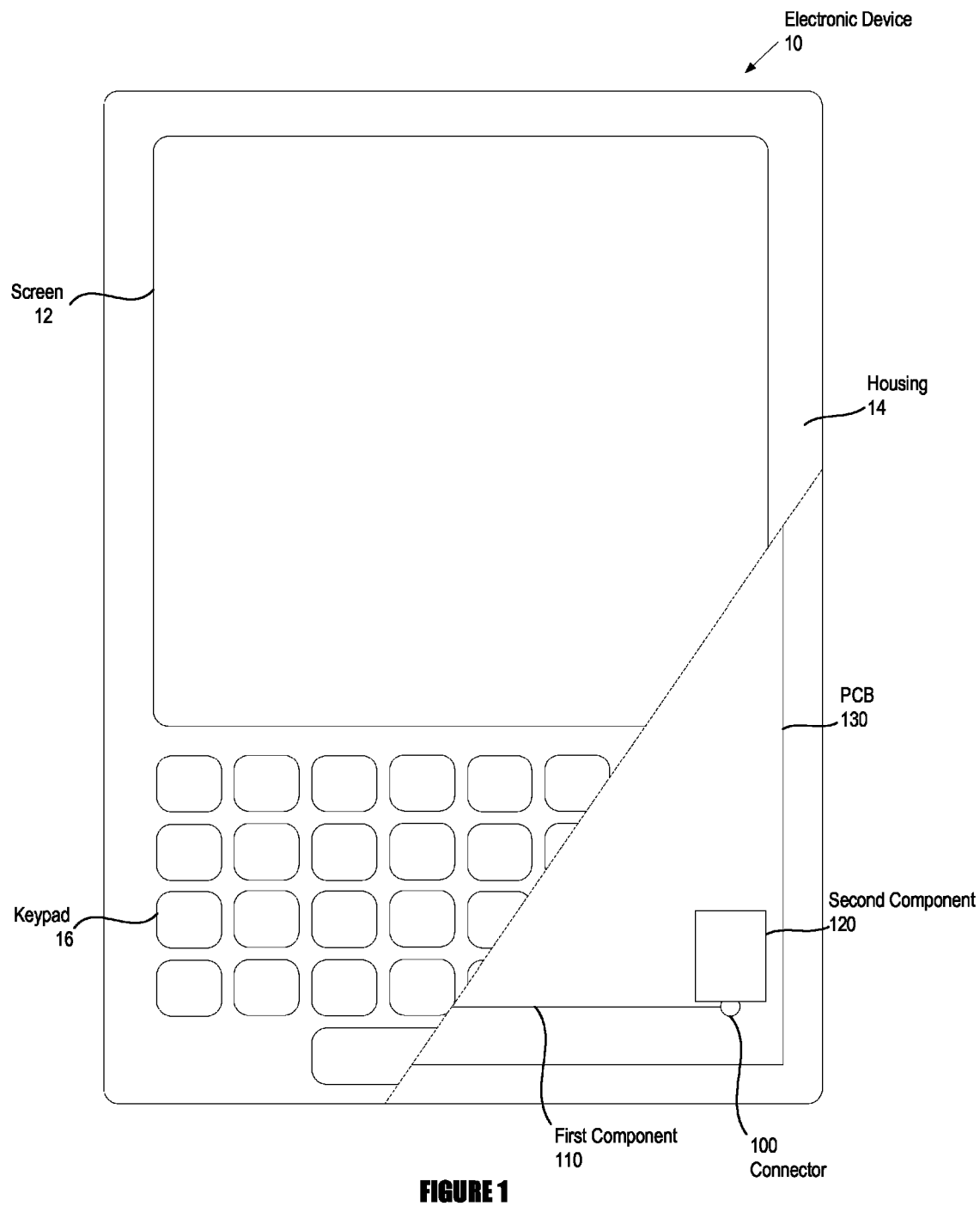
FIG. 1 illustrates a partially cutaway front view of an embodiment of an electronic device.

FIG. 1 illustrates a partially cutaway front view of an embodiment of an electronic device 10. The electronic device 10 may include an electronic book reader, a cellular telephone, a personal digital assistant (PDAs), a portable media player, a tablet computer, a netbook, or any portable, compact electronic device.

The electronic device 10 includes a screen 12 which can display text, images, or other media. In particular, the screen 12 may comprise a liquid crystal display (LCD), an electrophoretic ink (E ink) screen, an interferometric modulator (IMod) screen, or any other type of display. The screen 12 may include a plurality of pixels arranged in a grid having parameters that are individually configurable by the electronic device. For example, the electronic device 10 may be configured to configure the color and/or brightness of individual pixels so as to display an image, text, or other media.

The electronic device 10 includes a housing 14 which partially surrounds and protects the internal components of the electronic device 10, such as those described below with respect to FIG. 9. The housing 14 includes openings through which output devices, such as the screen 12 can transmit information to a user and through which input devices, such as the keypad 16, can receive information from a user. In one embodiment, the housing 14 is composed of plastic. In other embodiments, the housing is composed of other materials.

The housing 14 surrounds a printed circuit board (PCB) 130. The PCB 130 may have one or more electrical components attached thereto, including, for example, a resistor, a switch, a circuit, a chip, a processing device, or a storage device. The electrical components may include one or more conductive traces that are electrically coupled to other components. In particular, the PCB 130 includes a first component 110 on the PCB. The electronic device 10 further includes a second component 120 that is disposed apart from the PCB. The first component 110 and second component 120 may include one or more conductive elements.

The electronic device 10 may further include one or more connectors 100 that electrically couple components together. In one embodiment, the connectors 100 are spring loaded connectors. In other embodiments, the connectors may be of another type. Spring loaded connectors, alternatively referred to as pogo pins, may advantageously maintain a connection when the device is subject to vibration, shock, or other movement, as the spring adjusts the size of the connector in response to such movement. Further, the adjustable size of a spring loaded connector simplifies manufacturing as a single component can be used to bridge gaps of various sizes between components.

Figure 2:
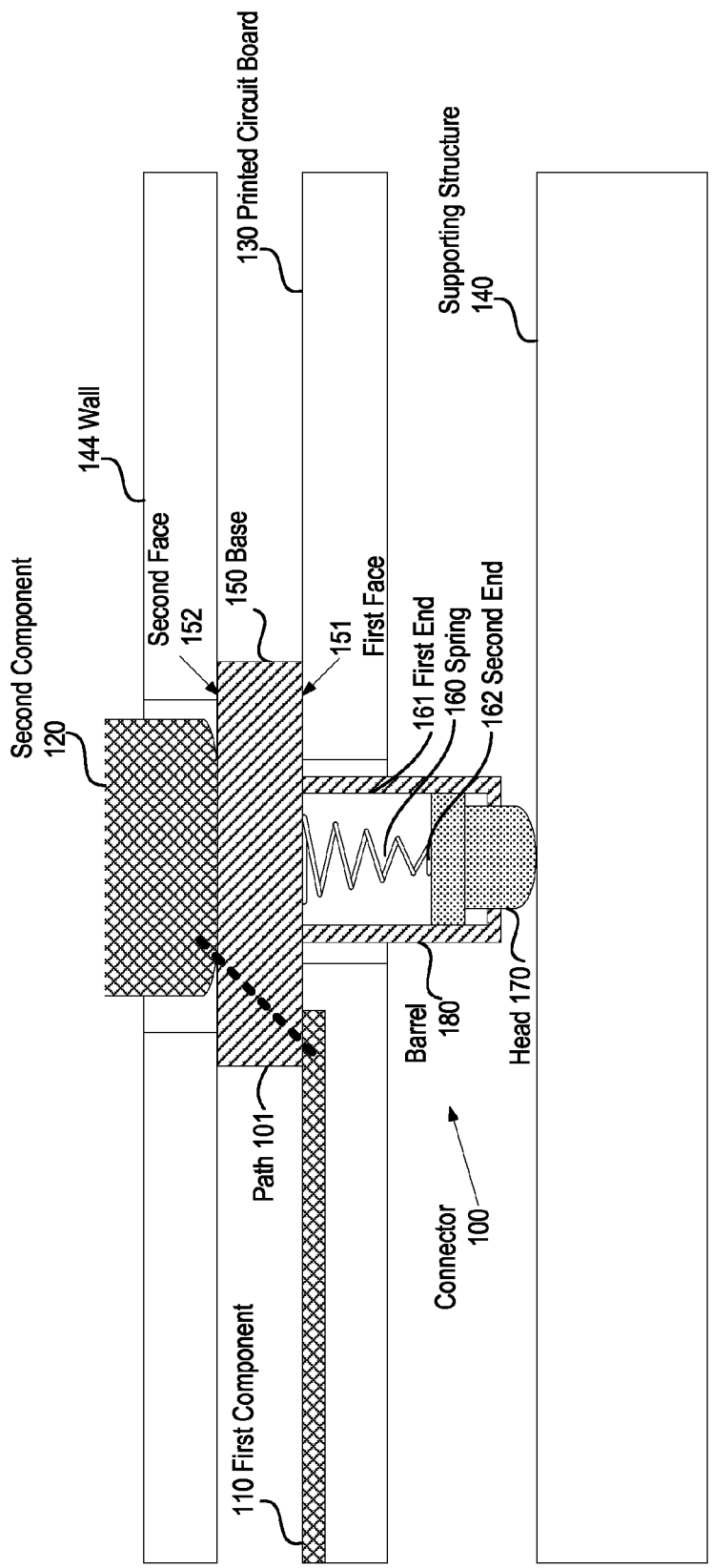
FIG. 2 illustrates a cross-sectional view of a first embodiment of an electrical connection between a first component and a second component.

FIG. 2 illustrates a cross-sectional view of a first embodiment of an electrical connection between a first component 110 and a second component 120. To form the connection, a connector 100 is disposed between the first component 110 and the second component 120. In particular, the connector 100 includes an electrically conductive base 150 that is disposed between and forms a complete conductive path 101 between the first component 110 and the second component 120. Thus, the base provides electrical connectivity between the first component 110 and the second component 120, or between conductive elements thereof. Current flowing from the first component 110 to the second component 120 may flow through the base 150 without flowing through any other portion of the connector 100.

In one embodiment, the first component 110 is attached a printed circuit board (PCB) 130 and the second component 120 is disposed apart from the printed circuit board 130. For example, in one embodiment, the first component 110 is a conductive trace disposed on the PCB 130 and the second component 120 is a battery (or a conductive lead thereof) or an antenna disposed apart from the PCB 130. In another embodiment, the first component 110 is a conductive trace disposed on PCB 130 and the second component 120 is a conductive trace disposed on a different PCB. In other embodiments, the first component 110 and second component 120 can be other components.

As mentioned above, the connector 100 includes an electrically conductive base 150. The base 150 may be composed of, for example, metal. In other embodiments, the base 150 may be made of other materials. The base 150 has a first face 151 opposite a second face 152. In forming the connection, in one embodiment, the first face 151 abuts the first component 110 and the second face 152 abuts the second component 120.

In one embodiment, the base 150 is held against first component 110 by a wall 144. The wall 144 includes a channel through which the second component 120 passes through to contact the base 150. In other embodiments, the base 150 is coupled to the first component 110 in other ways. For example, the base 150 may be attached to the first component 110 with an adhesive or solder. The base 150 may be mechanically fixed in position with respect to the first component 110 by a latch or an interference fit. In other embodiments, the base 150 is not attached to the first component 110 or is coupled by other methods.

The connector 100 includes a spring 160 having a first end 161 and a second end 162. The first end 161 of the spring 160 abuts the first face 151 of the base 150. The spring 160 may be any elastic object that can store mechanical energy. For example, the spring 160 may be a helical spring or a leaf spring composed of, e.g., metal. The spring 160 may be a piece of elastic material, such as rubber. In other embodiments the spring 160 may be of a different type or composed of a different material than those discussed above.

The connector 100 includes head 170 that abuts the second end 162 of the spring 160. In one embodiment, the head 170 is electrically conductive. However, because the contact path 101 between the first component 110 and second component 120 does not include the head 170, in other embodiments, the head 170 is not electrically conductive, but electrically insulative.

The connector 100 includes a barrel 180 attached to the first face 151 of the base 150. The barrel 180 surrounds the spring 160 and prevents the head 170 from becoming detached from the connector 100. Although described as a separate component, it is to be appreciated that the barrel 180 and base 150 may be integrally formed as a single piece of homogenous material.

In one embodiment, the head 170 of the connector 100 abuts and, by virtue of the spring 160, presses against a supporting structure 140. The supporting structure 140 may, for example, correspond to the housing 14 of FIG. 1. The supporting structure 140 may also be a midframe or a PCB separate from the PCB 130 through which the connector 100 passes. In other embodiments, the support structure 140 may be other components of the electronic device 10.

In one embodiment, the supporting structure 140 is non-conductive. For example, the supporting structure 140 may be made of plastic. In another embodiment, the supporting structure 140 is conductive, but the head 170 is nonconductive, preventing electrical coupling between the first or second component and the supporting structure 140. In another embodiment, the supporting structure 140 is conductive and the head 170 is conductive. Thus, the connector 100 provides not only an electrical connection between the first component 110 and the second component 120, but also between those components and the supporting structure 140.

Figure 3:
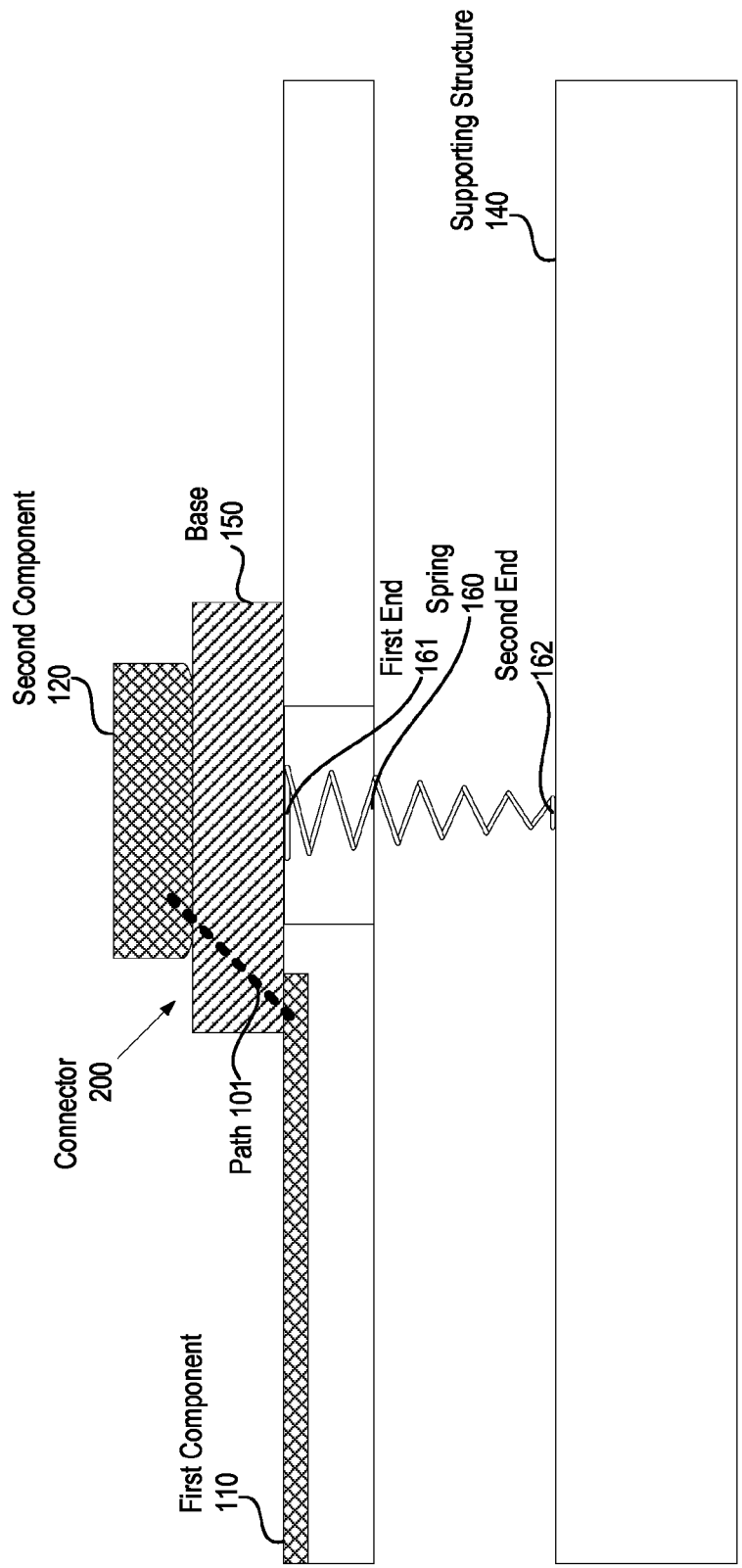
FIG. 3 illustrates a cross-sectional view of a second embodiment of an electrical connection between a first component and a second component.

FIG. 3 illustrates a cross-sectional view of a second embodiment of an electrical connection between a first component 110 and a second component 120. The electrical connection of FIG. 3 is substantially similar to that of FIG. 2; however, in the connection of FIG. 3, the connector 200 does not include a barrel or a head. Rather, the spring 160 abuts the supporting structure 140 directly. In particular, the second end 162 of the spring 160 abuts the supporting structure 140.

In one embodiment, the spring 160 is electrically conductive. Thus, the connector 200 provides not only an electrical connection between the first component 110 and the second component 120, but also between those components and the supporting structure 140. In another embodiment, the spring 160 is electrically insulative. For example, the spring 160 may be composed of metal surrounded by an insulating casing composed of plastic. Thus, the electrically insulative spring 160 does not electrically couple the base 150 to the supporting structure 140.

Figure 4:
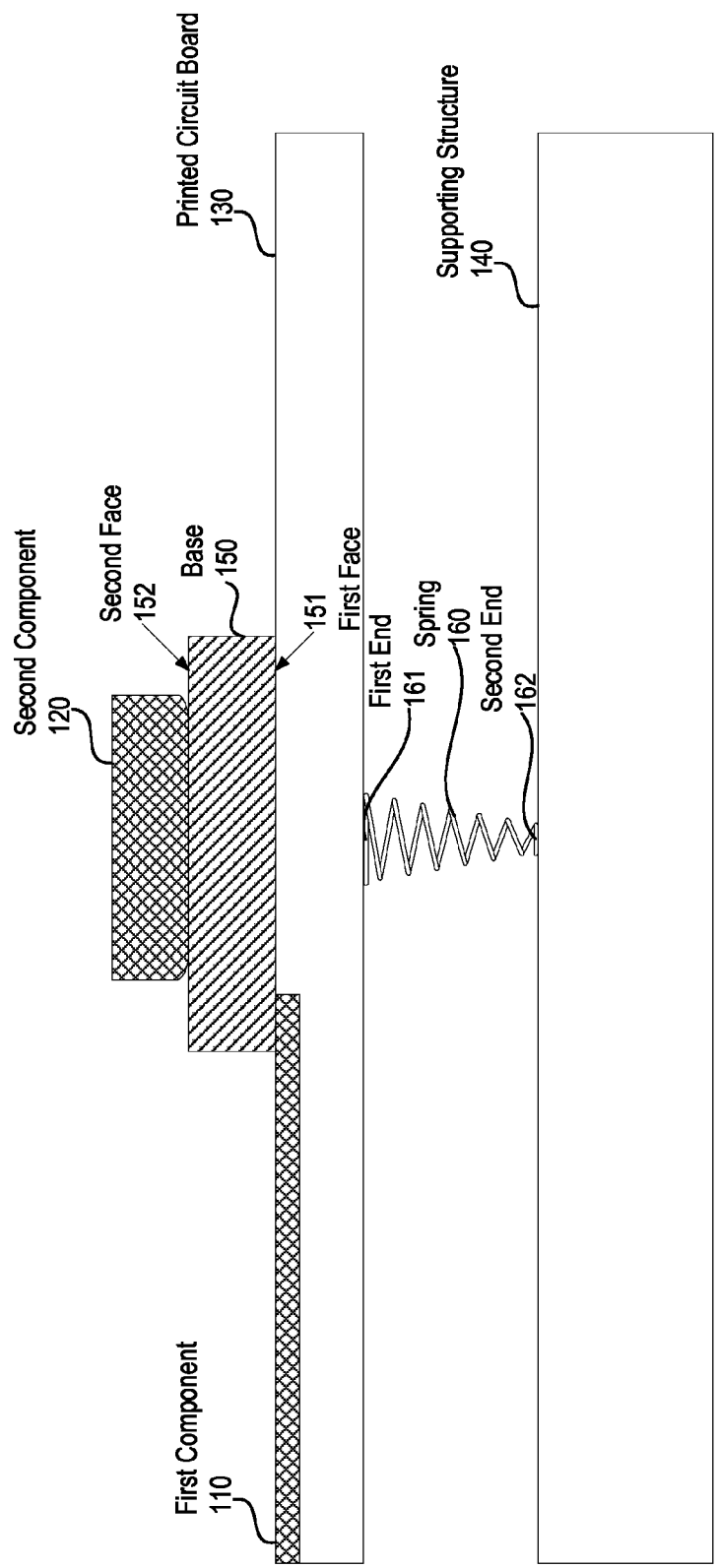
FIG. 4 illustrates a cross-sectional view of a third embodiment of an electrical connection between a first component and a second component.

FIG. 4 illustrates a cross-sectional view of a third embodiment of an electrical connection between a first component 110 and a second component 120. The electrical connection of FIG. 4 is substantially similar to that of FIG. 3; however, in the connection of FIG. 4, the connection is not made with a single connector, but with two physically separate components: a spring 160 and an electrically conductive base 150. As above, the base 150 has a first face 151 opposite a second face 152. In forming the connection, in one embodiment, the first face 151 abuts the first electrically conductive component 110 and the second face 152 abuts the second electrically conductive component 120.

The spring 160, rather than passing through the PCB 130, is disposed on the opposite size of the PCB 130 as the base 150. Thus, the base 150 is disposed on a first side of the PCB 130 and the spring 160 is disposed on a second side of the PCB 130 opposite the first side. As above, the spring includes a first end 161 opposite a second end 162. As in the connection of FIG. 3, the second end 162 abuts the supporting structure 140. However, in the connection of FIG. 4, the first end 161 abuts the PCB 130, rather than the first face 151 of the base 150.

In one embodiment, the spring 160 is disposed directly opposite the base 150. For example, at least one hypothetical line perpendicular to the PCB 130 and passing through the base 150 also passes through the spring 160. It will be appreciated that the line passes through the spring when it contacts the structure of the spring 160 or when it contacts a minimal imaginary convex region defined by and enclosing the spring. In another embodiment, such as that described below with respect to FIG. 5, no hypothetical line perpendicular to the PCB and passing through the base 150 passes through the spring 160.

Figure 5:
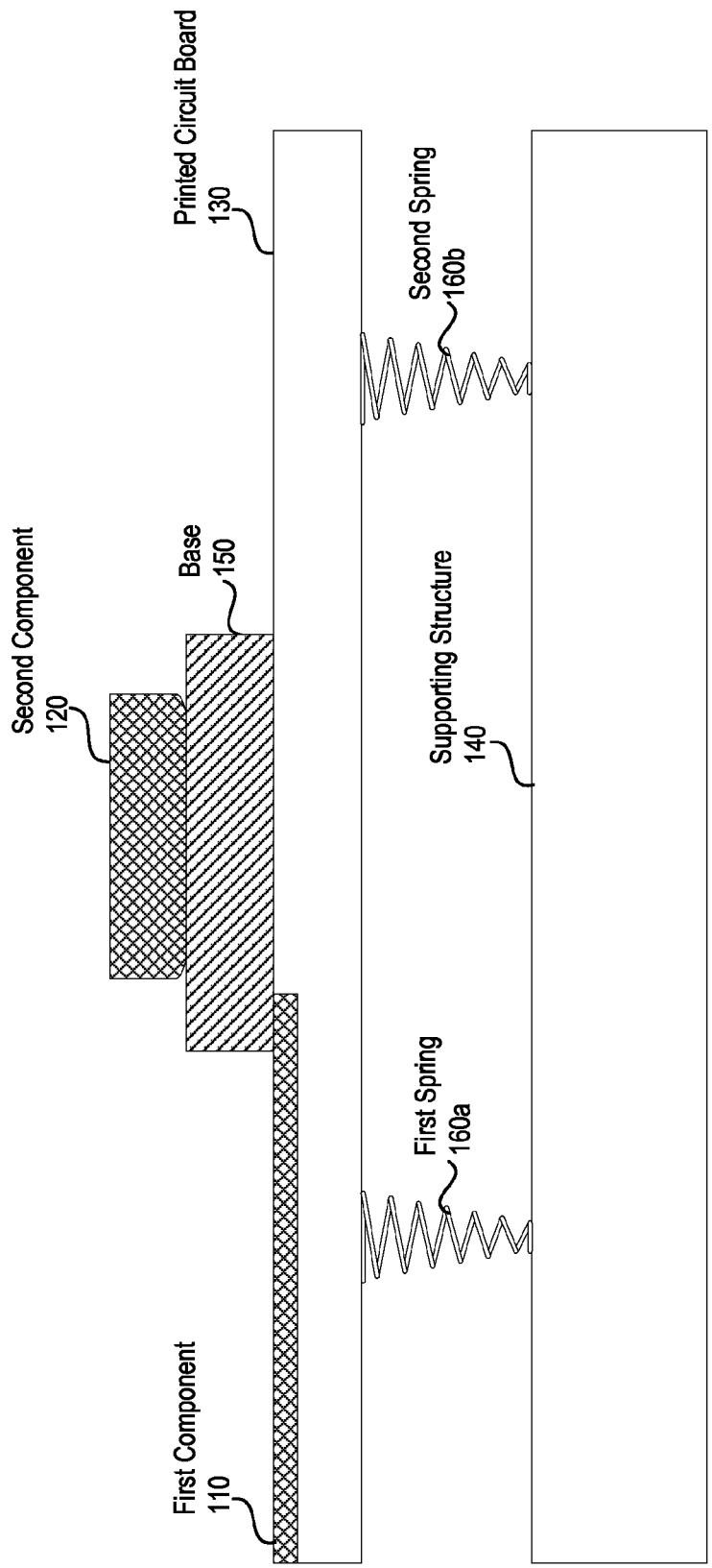
FIG. 5 illustrates a cross-sectional view of a fourth embodiment of an electrical connection between a first component and a second component.

FIG. 5 illustrates a cross-sectional view of a fourth embodiment of an electrical connection between a first component 110 and a second component 120. The electrical connection of FIG. 5 is substantially similar to that of FIG. 4; however, in the connection of FIG. 5, multiple springs 160a and 160b are disposed on the side of the PCB 130 opposite the base 150.

Figure 6:
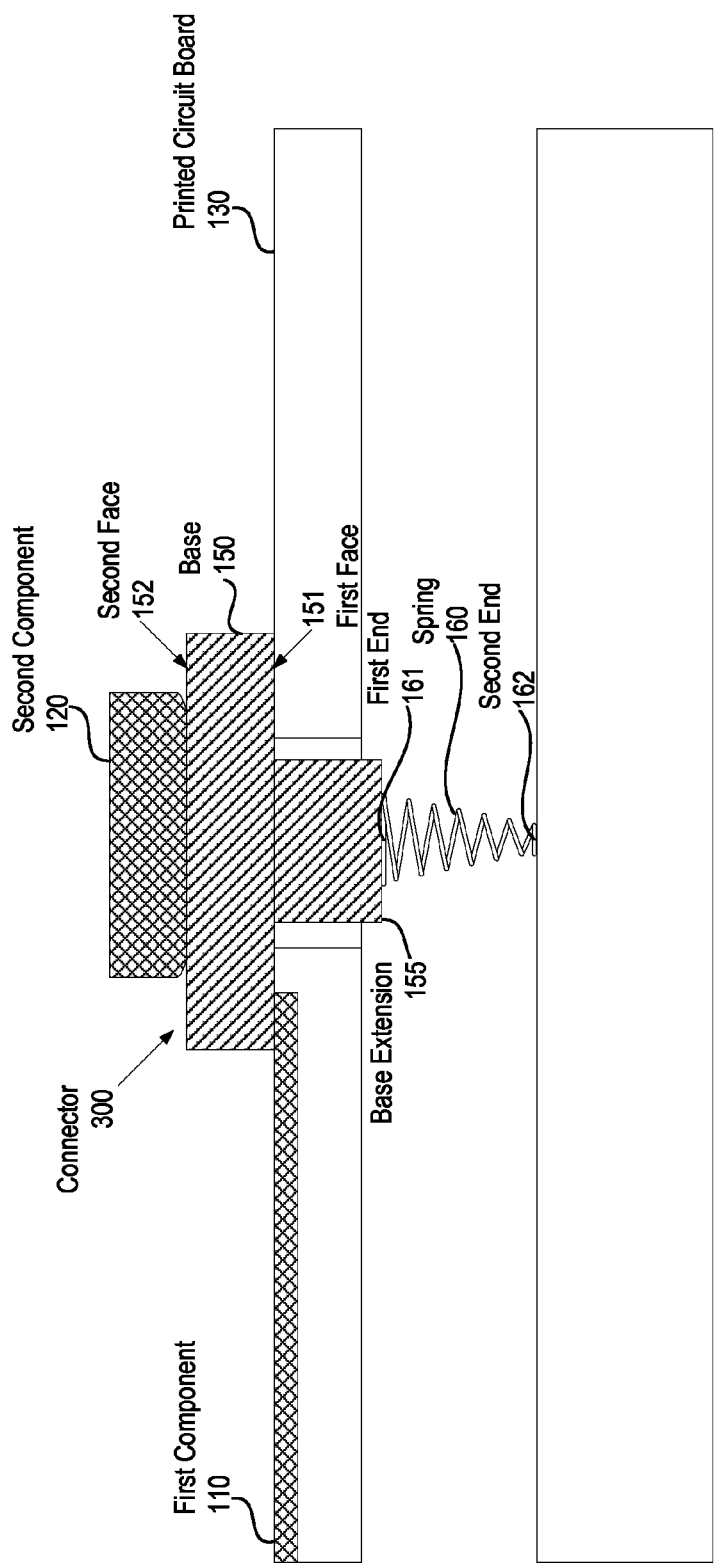
FIG. 6 illustrates a cross-sectional view of a fifth embodiment of an electrical connection between a first component and a second component.

FIG. 6 illustrates a cross-sectional view of a fifth embodiment of an electrical connection between a first component 110 and a second component 120. The electrical connection of FIG. 6 is substantially similar to that of FIG. 3; however, in the connection of FIG. 6, the spring 160 does not pass through the PCB 130. Rather, the connector 300 includes a base extension 155 attached to the first face 151 of the base 150 that passes through the PCB 130. The first end of the spring 161, rather than abutting the first face 151 of the base 150, abuts the base extension 155. Although described as a separate component, it is to be appreciated that the base extension 155 and base 150 may be integrally formed a single piece of homogenous material.

Although not shown in FIG. 6, in other embodiments, the connector 300 may include a barrel and a head as described above with respect to FIG. 2. The barrel, for example, may be attached to the base extension 155.

Figure 7:
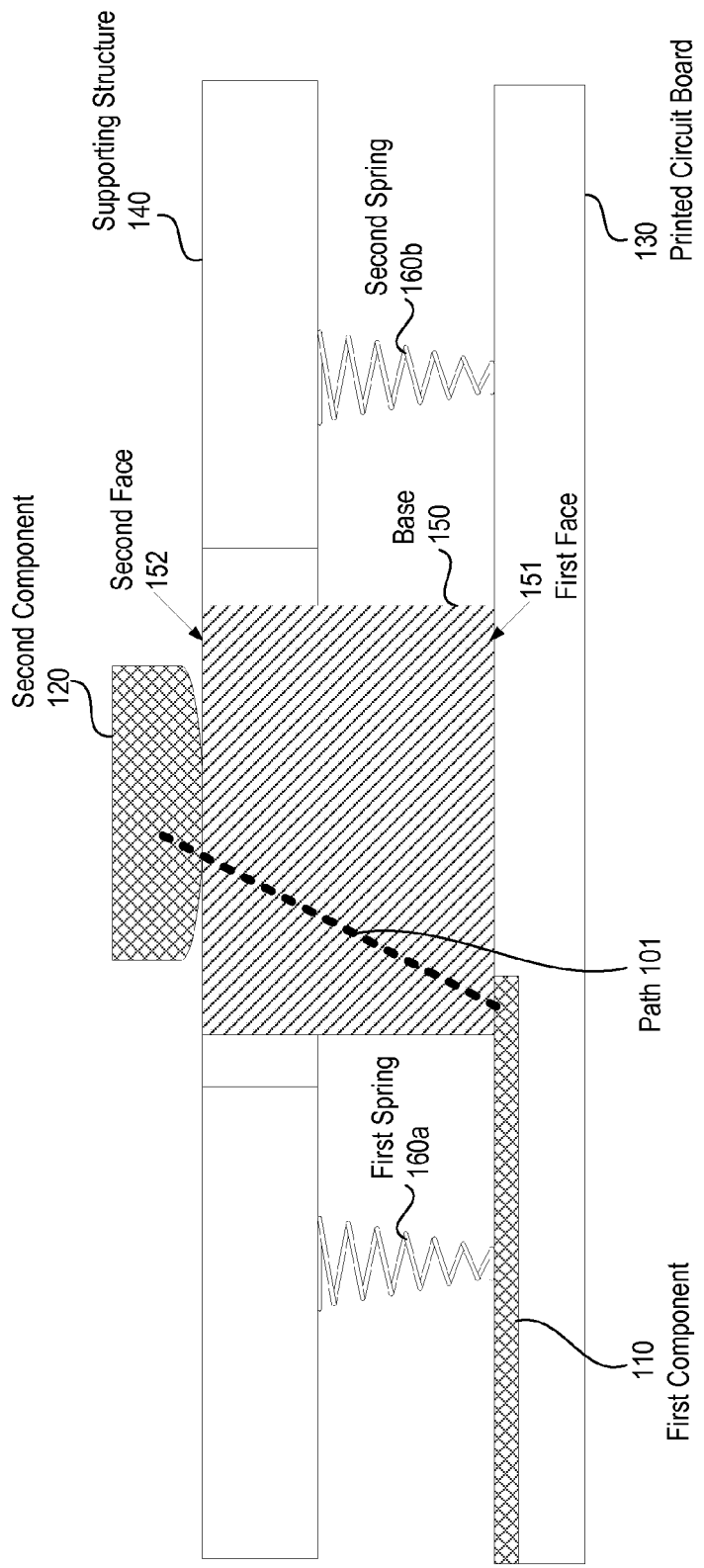
FIG. 7 illustrates a cross-sectional view of a sixth embodiment of an electrical connection between a first component and a second component.

FIG. 7 illustrates a cross-sectional view of a sixth embodiment of an electrical connection between a first component 110 and a second component 120. To form the connection, an electrically conductive base 150 is disposed between the first component 110 and the second component 120. The base 150 has a first face 151 opposite a second face 152. In forming the connection, in one embodiment, the first face 151 abuts the first component 110 and the second face 152 abuts the second component 120.

A first spring 160a and a second spring 160b mechanically couple the printed circuit board 130 and the supporting structure 140. In the embodiments described above with respect to FIGS. 2-6, downward force applied by the second component 120 upon the base 150 compresses the springs. In response, the compressed springs provide an upward force upon the base 150. Thus, the base 150 is squeezed or compressed. In the embodiment in FIG. 7, a downward force stretches the springs 160a and 160b. In response, the stretched springs 160a and 160b provide an upward force on the base 150 (via the PCB 130). Thus, as above, the base 150 is squeezed or compressed.

The compressive force applied to the base 150 (in both the embodiment of FIG. 7 and the embodiments described with respect to FIGS. 2-6) works to maintain the electrical connection of the first component 110 and the second component 120 through the base 150. For example, in one embodiment, the base 150 allows a relatively large amount of current to flow through it (as compared to, e.g., the spring 160 or the barrel 180) and the spring 160 provides a force to produce linear motion of the base 150 or of the connector of which the base is a part.

Figure 8:
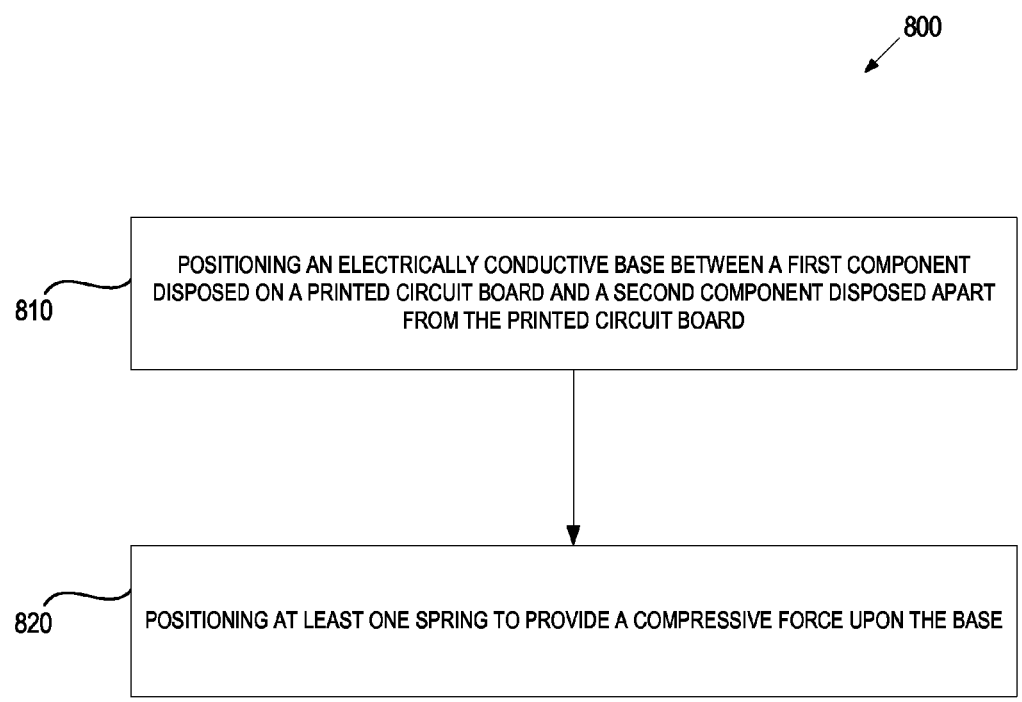
FIG. 8 illustrates a flowchart of a method of connecting electrical components.

FIG. 8 illustrates a flowchart of a method 800 of connecting electrical components. The method 800 begins, in block 810, with positioning an electrically conductive base between a first component disposed on a printed circuit board and a second component disposed apart from the printed circuit board.

In block 820, at least one spring is positioned to provide a compressive force upon the base and maintain an electrical connection between the first component and the second component through the base.

The printed circuit board has a first side opposite a second side. In one embodiment, the base is positioned on the first side and the at least one spring is positioned on the second side. Such an arrangement is illustrated, for example, by the connection of FIG. 4, among others. In another embodiment, the base is positioned on the first side and the at least one spring is also positioned on the first side. Such an arrangement is illustrated, for example, by the connection in FIG. 7.

In one embodiment, positioning the at least one spring includes positioning the at least one spring to have the at least one spring pass through the printed circuit board. Such an arrangement is illustrated, for example, by the connection in FIG. 2, among others.

In one embodiment, positioning the base and positioning the at least one spring is performed as a single step. For example, both steps may be performed by positioning a connector. The connector may be, for example, the connector 100 of FIG. 2. Thus, the steps in both block 810 and 820 may be performed simultaneously. Alternatively, the steps in block 810 and 820 can be performed sequentially or in reverse order.

Figure 9:
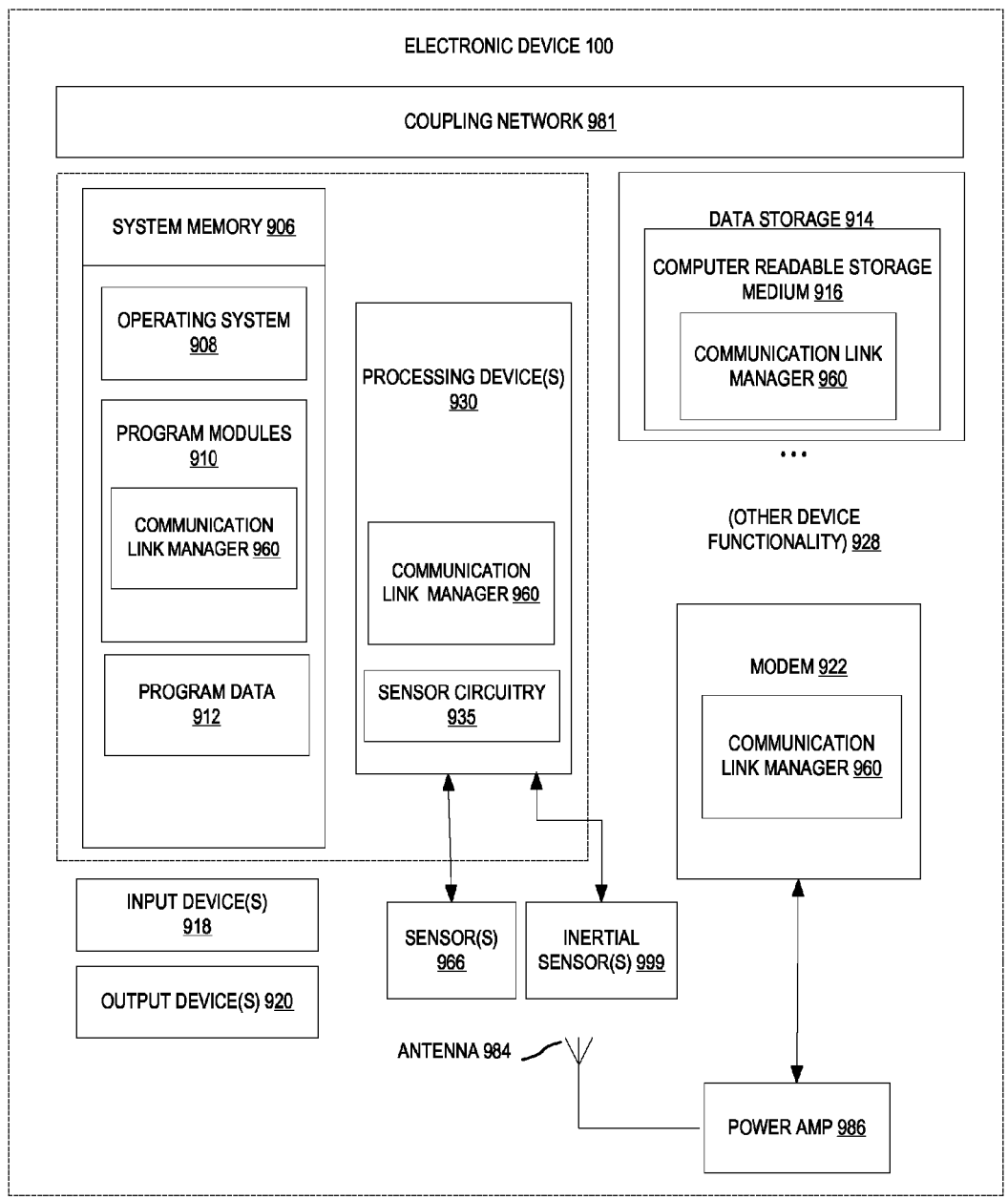
FIG. 9 illustrates a functional block diagram of an embodiment of an electronic device.

FIG. 9 illustrates a functional block diagram of an embodiment of an electronic device. The electronic device 900 may correspond to the electronic device 100 of FIG. 1 and may be any type of computing device such as an electronic book reader, a PDA, a mobile phone, a laptop computer, a portable media player, a tablet computer, a smart phone, a camera, a video camera, a netbook, a desktop computer, a gaming console, a digital video disc (DVD) player, a computing pad, a media center, and the like.

The electronic device 900 includes one or more processing devices 930, such as one or more central processing units (CPUs), microcontrollers, field programmable gate arrays, or other types of processing devices. The electronic device 900 also includes system memory 906, which may correspond to any combination of volatile and/or non-volatile storage mechanisms. The system memory 906 may include one or more of read-only memory (ROM), flash memory, dynamic random access memory (DRAM) such as synchronous DRAM (SDRAM)), and static random access memory (SRAM)). The system memory 906 stores information which provides an operating system component 908, various program modules 910 such as communication link manager 960, program data 912, and/or other components. The electronic device 900 performs functions by using the processing device(s) 930 to execute instructions provided by the system memory 906.

The electronic device 900 also includes a data storage device 914 that may be composed of one or more types of removable storage and/or one or more types of non-removable storage. The data storage device 914 includes a computer-readable storage medium 916 on which is stored one or more sets of instructions embodying any one or more of the methodologies or functions described herein. As shown, instructions for the communication link manager 960 may reside, completely or at least partially, within the computer readable storage medium 916, system memory 906 and/or within the processing device(s) 930 during execution thereof by the electronic device 900, the system memory 906 and the processing device(s) 930 also constituting computer-readable media. The electronic device 900 may also include one or more input devices 918 (keyboard, mouse device, specialized selection keys, etc.) and one or more output devices 920 (displays, printers, audio output mechanisms, etc.). In one embodiment, the input devices 918 and the output devices 920 may be combined into a single device (e.g., a touch screen).

The electronic device 900 further includes a wireless modem 922 to allow the electronic device 900 to wirelessly communicate with other computing devices. The wireless modem 922 allows the electronic device 900 to handle both voice and non-voice communications (such as communications for text messages, multimedia messages, media downloads, web browsing, etc.). The wireless modem 922 may also allow the electronic device 900 to handle other signaling data to facilitate communication of the voice and non-voice data between the electronic device 900 and other devices. The wireless modem 922 may provide network connectivity using any type of mobile network technology including, for example, cellular digital packet data (CDPD), general packet radio service (GPRS), enhanced data rates for global evolution (EDGE), universal mobile telecommunications system (UMTS), 1 times radio transmission technology (1xRTT), evaluation data optimized (EVDO), high-speed down-link packet access (HSDPA), WiFi, HSPA+, WiMAX, Long Term Evolution (LTE) and LTE Advanced (sometimes generally referred to as 4G), etc. In one embodiment, the wireless modem includes the communication link manager 960 in addition to, or instead of, the communication link manager 960 being included in the computer readable storage medium 916, system memory 906 and/or processing device(s) 930. The communication link manager 960 may be implemented as hardware, firmware and/or software of the wireless modem 922. It should be noted that the modem 922 may include a processing component that performs various operations to handle both voice and non-voice communications. This processing component can execute the communication link manager 960. Alternatively, the communication link manager 960 can be executed by a processing component of the electronic device, such as the processing device 930.

The wireless modem 922 may generate signals and send these signals to power amplifier (amp) 980 for amplification, after which they are wirelessly transmitted via antenna 984. The antenna 984 may be directional, omni-directional or non-directional antennas. In addition to sending data, the antenna 984 can be deployed to receive data, which is sent to wireless modem 922 and transferred to processing device(s) 930. In one embodiment, the antenna 984 may be used to form communication links between the electronic device 900 and a base station (e.g., a NodeB or a cell tower).

The processing device(s) 930 and the modem 922 may be a general-purpose processing devices such as a microprocessor, central processing unit, or the like. More particularly, the processing device(s) 930 and the modem 922 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device(s) 930 and the modem 922 may also be one or more special-purpose processing devices such as an application specific integrated circuit (ASIC), a field programmable gate array (FPGA), a digital signal processor (DSP), network processor, or the like.

In one embodiment, electronic device 900 includes one or more sensors 966 such as a physical contact sensor or close proximity sensors. The sensors 966 can detect the human body parts proximate to the electronic device, and convey information regarding the detection to processing device(s) 930. In one embodiment, the sensors 966 may be capacitive sensors that are configured to measure capacitance generated by the human body part proximate to the electronic device using any one of various techniques known in the art, for example, relaxation oscillation, a current verses voltage phase shift comparison, resistor-capacitor charge timing, capacitive bridge division, charge transfer, sigma-delta modulation, or charge-accumulation. In an alternative embodiment, the sensors 966 may also be optical (e.g., infrared) sensors that use an emitter and receiver pair to detect the presence of opaque objects. Alternatively, the sensors 966 may be inductive sensors, which include an inductive loop. When the presence of a human body part (or metal object) is brought close to the inductive sensor, an induction of the inductive loop changes, causing the human body part to be detected. Alternatively, the sensors 966 may be ultrasonic sensors that emit an ultrasonic signal and measure a time duration between when a signal is transmitted and the reflection of that signal received (a.k.a., flight response). The sensors 966 may also include other types of sensors, such as those that operate using the detection principles of resistive (e.g., analog resistive, digital resistive or residual resistive), surface acoustic wave, electromagnetic, near field imaging, or other technologies. In one embodiment, multiple different types of sensors are used. It should also be noted that the sensors 966 may be used to determine a distance between one or more of the antennas and the detected human body part. Though the detected object is described herein as a human body part, other types of objects may also be detected depending on the sensing technologies used.

In one embodiment, electronic device 900 includes one or more inertial sensors 999. The inertial sensors 999 can be used to detect motion of the electronic device 900. In one embodiment, the inertial sensors 999 detect linear accelerations (translational movement) and angular accelerations (rotational movement). The inertial sensors 999 may include accelerometers and/or gyroscopes. Gyroscopes use principals of angular momentum to detect changes in orientation (e.g., changes in pitch, roll and twist). Accelerometers measure accelerations along one or more axes (e.g., translational changes). The gyroscope and accelerometer may be separate sensors, or may be combined into a single sensor. The inertial sensors 999 in one embodiment are micro-electromechanical systems (MEMS) sensors.

In one embodiment, the motion data from the one or more inertial sensors 399 may be used to determine an orientation of the electronic device 300 to determine if a communication link criterion is satisfied (e.g., whether the electronic device 900 is in proximity to a user's body). In another embodiment, the sensor data from the one or more sensors 966 may be used to determine an orientation of the electronic device 900 for to determine if a communication link criterion is satisfied. In a further embodiment, of the motion data and the sensor data may be used to determine whether a communication link criterion is satisfied.

The processing device(s) 930 may include sensor circuitry 935 (e.g., sensor device drivers) that enables the processing device(s) 930 to interpret signals received from the sensor(s) 966 and/or inertial sensors 999. In one embodiment, the sensors 966 and/or inertial sensors 999 output fully processed signals to the processing device(s) 930. For example, the sensors 966 may output a distance, a detected/not detected signal, etc. using a single line interface or a multi-line interface. Similarly, inertial sensors 999 may output an acceleration value (e.g., in Gs). In another embodiment, the sensors 966 output, for example, positional data and/or object presence data (e.g., of a human body part) to the processing devices) 930 without first processing the data. Similarly, inertial sensors 999 may output, for example, voltage values that can be interpreted as acceleration values. In either instance, the processing device(s) 930 may use the sensor circuitry 935 to process and/or interpret the received data. If data is received from multiple sensors 966 and/or inertial sensors 999, processing the data may include averaging the data, identifying a maximum from the data, or otherwise combining the data from the multiple sensors. In one embodiment, in which the sensors 966 include a sensor array, numerous sensors, or a touch panel, processing the data includes determining where on the electronic device the human body part is located from multiple sensor readings.

The electronic device 100 includes a coupling network 981 that couples the various components described above to achieve the recited functionality. For example, the coupling network 981 may include a printed circuit board which supports and stabilizes the position of the various components. The coupling network 981 may include one or more conductive traces on a printed circuit board. The coupling network 981 may include one or more electrically conductive connectors disposed to couple components. For example, one of the connectors may electrically couple a first component disposed on a printed circuit board and a second component disposed apart from a printed circuit board.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

It is to be understood that the above description is intended to be illustrative, and not restrictive. Many other embodiments will be apparent to those of skill in the art upon reading and understanding the above description. The scope of the present invention should, therefore, be determined with reference to the appended claims, along with the full scope of equivalents to which such claims are entitled.

What is claimed is:

1. An electronic device comprising:
   a printed circuit board (PCB) comprising:
      a first side:
      a second side that is opposite the first side; and
      a first conductive element; and
   a wall disposed on the first side of the PCB and having a channel through the wall;
   a supporting structure disposed on the second side of the PCB;
   a spring structure disposed between a first side of an electrically conductive base and the supporting structure; and
   the electrically conductive base disposed on the first side of the PCB and corresponding to the channel, the electrically conductive base forming a conductive path between the first conductive element and the electrically conductive base only when compressive force is applied to the spring structure via the electrically conductive base.

2. The electronic device of claim 1, wherein the electrically conductive base has a first surface opposite a second surface, wherein the first surface abuts the first conductive element and wherein the second surface faces the channel.

3. The electronic device of claim 1, wherein the spring structure is at least partially disposed through the PCB.

4. The electronic device of claim 1, wherein the electronic device further comprises a connector comprising:
   a head disposed between the spring structure and the support structure; and
   a barrel disposed between the electrically conductive base and the supporting structure and at least partially surrounding the spring structure.

5. The electronic device of claim 4, wherein at least one of the spring structure, head or barrel is insulative.

6. The electronic device of claim 1, wherein the spring structure comprises at least one of a helical spring or a plurality of springs.

7. The electronic device of claim 1, further comprising a second conductive element disposed apart from the PCB and at least partially within the channel.

8. The electronic device of claim 7, wherein the connector provides an electrically conductive path between the first conductive element and the second conductive element through the electrically conductive base.

9. The electronic device of claim 7, wherein the first conductive element comprises a first conductive trace of the PCB and the second conductive element comprises at least one of a battery, an antenna, or a second conductive trace of another PCB.

10. An electronic connector comprising:
    a printed circuit board (PCB) comprising a first conductive element;
    an electrically conductive base, disposed on a first side of the PCB, configured to provide electrical connectivity between the first conductive element disposed on the first side of the printed circuit board and the electrically conductive base only when compressive force is applied to a spring structure via the electrically conductive base through a channel of a wall; and
    the spring structure disposed on a same side of the electrically conductive base as the printed circuit board and at least partially disposed between the electrically conductive base and a support structure, wherein the spring is configured to provide the compressive force between the support structure and the electrically conductive base.

11. The electronic connector of claim 10, the printed circuit board having the first side opposite a second side, wherein the base is disposed on the first side and the spring structure is at least partially disposed on the second side.

12. The electronic connector of claim 10, further comprising a head coupled to the spring structure and a barrel surrounding the spring, wherein the electrical connectivity is maintained via a conductive path that passes through the base, does not pass through the spring structure, does not pass through the barrel, and does not pass through the head.

13. The electronic connector of claim 12, wherein at least one of the spring structure, head or barrel is insulative.

14. An electronic device comprising:
    a printed circuit board (PCB) having a first side opposite a second side;
    a first conductive element disposed on the first side of the PCB and coupled to the PCB;
    a second conductive element disposed in a channel of a wall and located coplanar to the first side of the PCB and spaced apart from the PCB;
    a supporting structure disposed on the second side of the PCB;
    an electrically conductive base at least partially disposed on the first side of the PCB and providing a complete conductive path between the first conductive element and the electrically conductive base only when compressive force is applied to a spring structure via the electrically conductive base; and
    the spring structure at least partially disposed on the second side of the PCB and disposed between the electrically conductive base and the supporting structure.

15. The electronic device of claim 14, wherein the electrically conductive base comprises an extension that passes through the PCB.

16. The electronic device of claim 14, wherein the spring structure comprises a first spring that passes through the PCB.

17. The electronic device of claim 14, wherein the spring structure comprises a first spring positioned to have at least one line generally perpendicular to the printed circuit board and passing through the electrically conductive base also pass through the first spring.

18. The electronic device of claim 14, wherein the spring structure comprises a plurality of springs.

19. The electronic device of claim 14, wherein the spring structure comprises a first spring and a second spring positioned to have any line generally perpendicular to the printed circuit board and passing through the electrically conductive base not pass through the first spring and not pass through the second spring.

* * * * *